(12) United States Patent
Nishino et al.

(10) Patent No.: US 6,285,973 B1
(45) Date of Patent: Sep. 4, 2001

(54) APPARATUS FOR, AND METHOD OF, CALCULATING ELECTROMAGNETIC FIELD STRENGTH AND MEDIUM FOR RECORDING PROGRAM TO ACHIEVE THE METHOD

(75) Inventors: Sekiji Nishino; Kenji Nagase, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/081,043

(22) Filed: May 19, 1998

(30) Foreign Application Priority Data

Nov. 26, 1997 (JP) .................................................... 9-324649

(51) Int. Cl.[7] .............................. G06F 17/50; G06F 9/455
(52) U.S. Cl. .................................... 703/13; 716/5; 716/20
(58) Field of Search .................................. 703/2, 13, 22; 716/4, 5, 20

(56) References Cited

U.S. PATENT DOCUMENTS

| | | |
|---|---|---|
| 5,625,578 | 4/1997 | Du Cloux et al. . |
| 5,650,935 * | 7/1997 | Nishino et al. ......................... 702/57 |
| 5,812,434 * | 9/1998 | Nagase et al. ............................. 703/2 |
| 5,815,414 * | 9/1998 | Funaki et al. ............................ 703/21 |
| 5,940,310 * | 8/1999 | Yamaguchi et al. ...................... 703/4 |
| 6,058,258 * | 5/2000 | Cullum et al. ............................ 703/2 |

FOREIGN PATENT DOCUMENTS

| | | |
|---|---|---|
| 196 16 772 | 10/1996 | (DE) . |
| 196 23 688 | 12/1996 | (DE) . |
| 196 17 977 | 1/1997 | (DE) . |
| 7-234890 | 9/1995 | (JP) . |
| 7-302258 | 11/1995 | (JP) . |
| 7-302277 | 11/1995 | (JP) . |
| 7-302278 | 11/1995 | (JP) . |
| 8-122377 | 5/1996 | (JP) . |
| 8-304491 | 11/1996 | (JP) . |
| 8-304492 | 11/1996 | (JP) . |
| 8-304493 | 11/1996 | (JP) . |
| 8-304494 | 11/1996 | (JP) . |

OTHER PUBLICATIONS

Huang et al., Y. Three Dimensional Modelling of EM Fields in the Human Head, 9th international Conference on Antennas and Propagation, 1995, (Conf. Publ. No. 407), pp. 223–226, Apr. 1995.*

(List continued on next page.)

Primary Examiner—Kevin J. Teska
Assistant Examiner—Russell W. Frejd
(74) Attorney, Agent, or Firm—Staas & Halsey LLP

(57) ABSTRACT

A method calculates the strength of an electromagnetic field radiated from an electric circuit device according to analytic data. The method includes the steps of sequentially displaying procedures that include at least a procedure for prompting a user to enter external dimensions of the electric circuit device and a procedure for prompting the user to enter signal frequencies on which the electric circuit device is divided into meshes and analyzed; letting the user interactively set primary data according to the displayed procedures; preparing a model of the electric circuit device according to the primary data; and preparing the analytic data according to the model. Also provided are an apparatus for achieving the method and a medium for storing a program that executes the method. These method, apparatus, and medium enable even a novice to easily and quickly set the primary data and efficiently calculate the electromagnetic field strength.

20 Claims, 29 Drawing Sheets

OTHER PUBLICATIONS

Hussein et al., M. FDTD Applications to Electromagnetic interference and Shielding, WESCANEX 95, Communications, Power and Computing, IEEE, vol. 2, 1995, pp. 478–482, Jan. 1995.*

Shibab et al., S. EMI and EMC in High Voltage Energy Systems, 1992 Regional Symposium on Electromagnetic Compatibility, 1992, From a Unified Region to a Unified World, pp. 4.1.6/1–4.1.6/3, Jan. 1992.*

Feliziani et al., M. Modeling of Electromagnetic Fields and Electrical Circuits with Lumped and Distributed Elements by the WETD Method, IEEE Transactions on Magnetics, vol. 35, No. 3, May 1999, pp. 1666–1669.*

Rioux–Damidau et al., F. Finite Element Modelling of Electromagnetic Fields Using Different Types of Variables and Boundary Conditions, IEEE Transactions on Magnetics, vol. 28, No. 2, Mar. 1992, pp. 1126–1129.*

Ivanov. V.YA. Computer Simulation. The Problems of High– Current Electronics, 11th IEEE International Pulsed Power Conference, 1997, vol. 2, pp. 1251–1257, Mar. 1997.*

David et al., R. S. Electromagnetic Field Computations on Massively Parallel Computers, Southcon/95, Conference Record, 1995, pp. 368–373, Jan. 1995.*

Herring et al., J. L. Multigrid Transmission–Line Modelling Method for Solving Electromagnetic Field Problems, Electronics Letters, vol. 27, No. 20, Sep. 26, 1991, pp. 1794–1795, Apr. 1995.*

* cited by examiner

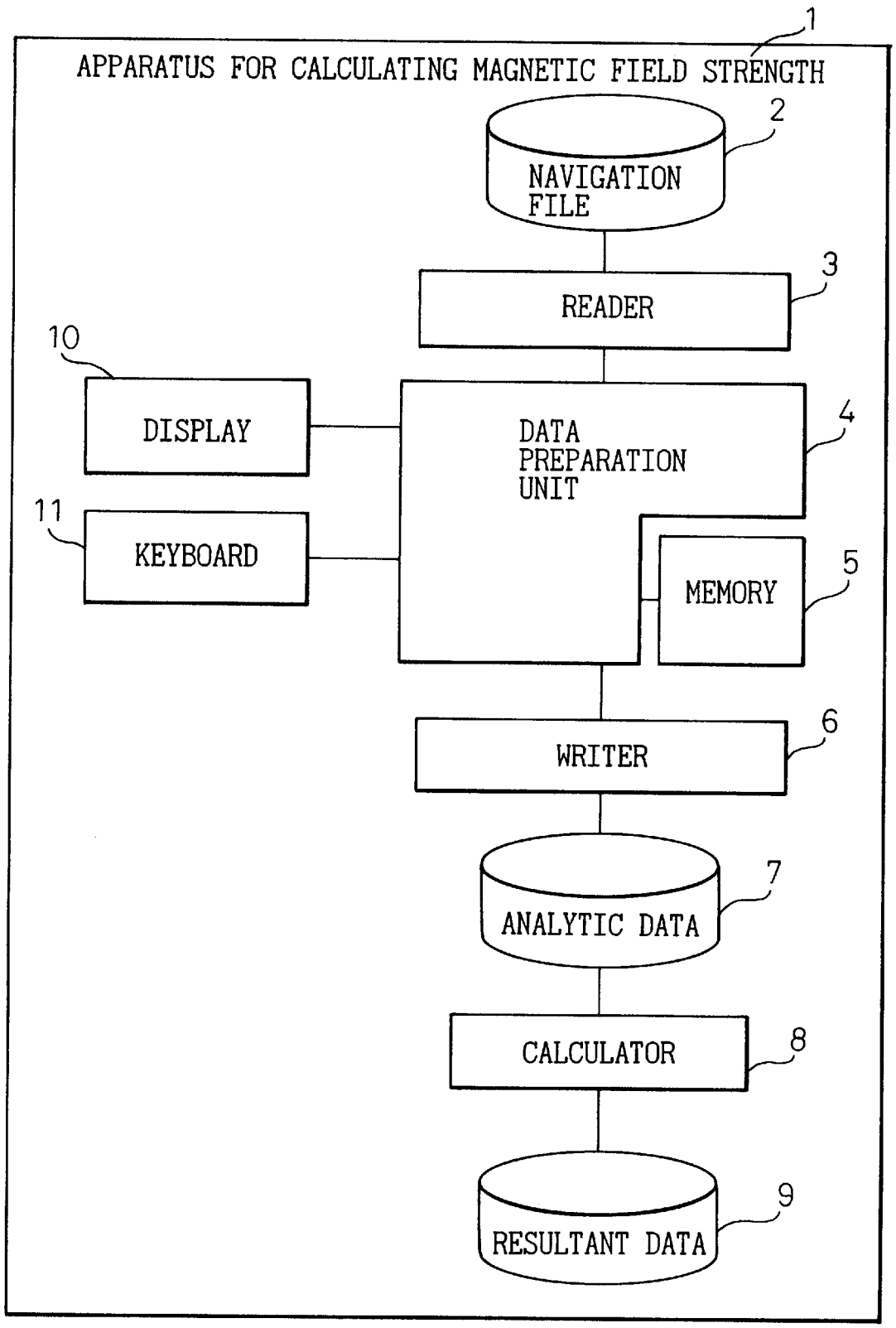

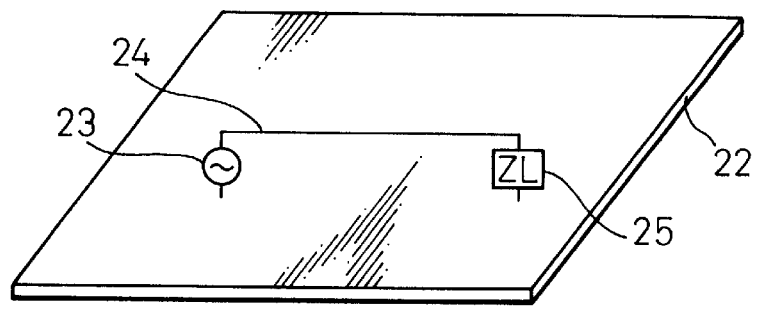
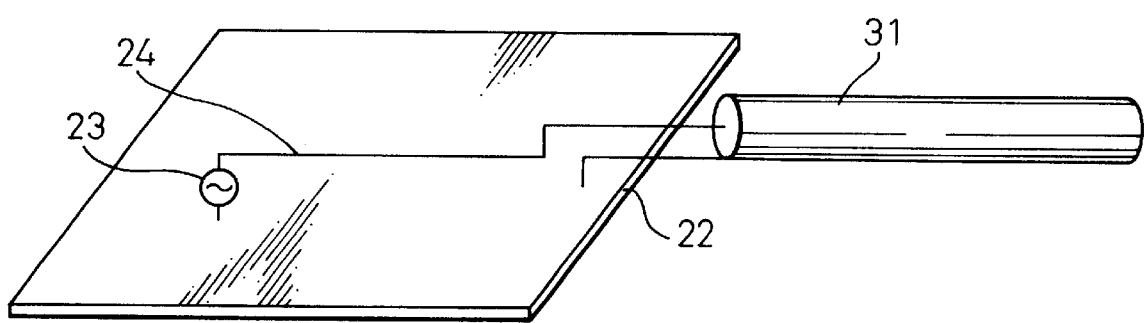

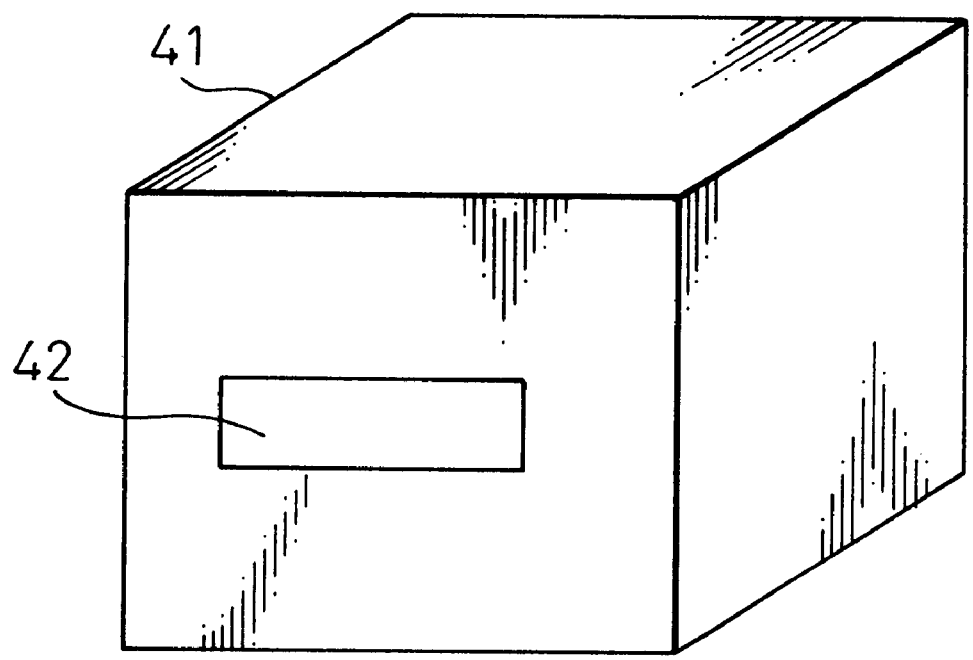

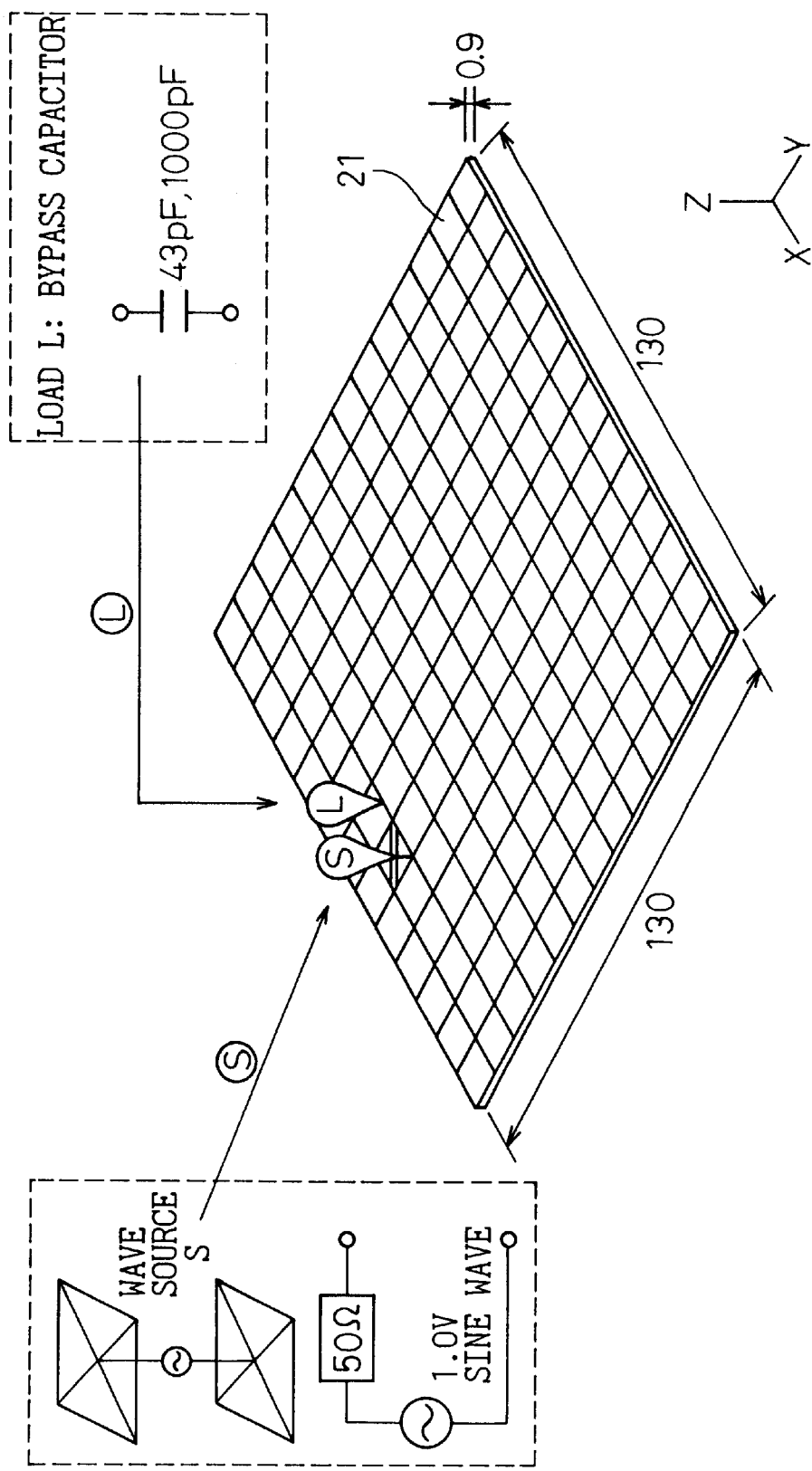

Fig.11A

NAME "EFFECT OF EMI FILTER" ——————————— NAVIGATION NAME

PROCEDURE 1 "ENTERING EXTERNAL DIMENSIONS OF BOARD" ——— PROCEDURE NAME (PROCEDURE No.1)
"ENTER DIMENSIONS X AND Y" ——————————————— MESSAGE IN PARAMETER WINDOW
set-board-size ——————————————————————————— WINDOW NAME PROCEDURE 2 "ENTERING LAYER DIMENSIONS" ———————————— PROCEDURE NAME (PROCEDURE No.2)
"ENTER LAYER DIMENSIONS" ————————————————— MESSAGE IN PARAMETER WINDOW
set-layer-size ———————————————————————————— WINDOW NAME
　　　　　　　　　　　　　　　　　　　　　　　　　　　　　　※ DITTO FOR THE BELOW PROCEDURE 3 "ENTERING PATTERN STRUCTURE"
"ENTER PATTERN LENGTH AND WIDTH AND EMI FILTER LOCATION"
set-patern PROCEDURE 4 "ENTERING DRIVER NAME"
"ENTER THE NAMES OF DRIVER AND SPICE NODE"
driver-set

Fig.11B

PROCEDURE 5 "ENTERING RECEIVER NAME"
"ENTER THE NAMES OF RECEIVER AND SPICE NODE"
receiver-set PROCEDURE 6 "SELECTING EMI FILTER"
"SELECT EMI FILTER IN LIBRARY"
components-select PROCEDURE 7 "ENTERING SPECTRUM OBSERVATION POINT"
"ENTER OBSERVATION POINT CONDITIONS"
spectrum-set PROCEDURE 8 "ENTERING RADIATION PATTERN OBSERVATION POINT"
"ENTER OBSERVATION POINT CONDITIONS"
radiation-set PROCEDURE 9 "ENTERING ANALYTIC FREQUENCIES"
"ENTER ANALYTIC FREQUENCY RANGE"
frequency-set

PROCEDURE 1

PROCEDURE 9

| ENTERING ANALYTIC FREQUENCIES |

ENTER ANALYTIC FREQUENCY RANGE

☐ ▼[MHz] ~ ☐ ▼[MHz]

[END]  [RETURN]

※ HELP MESSAGE

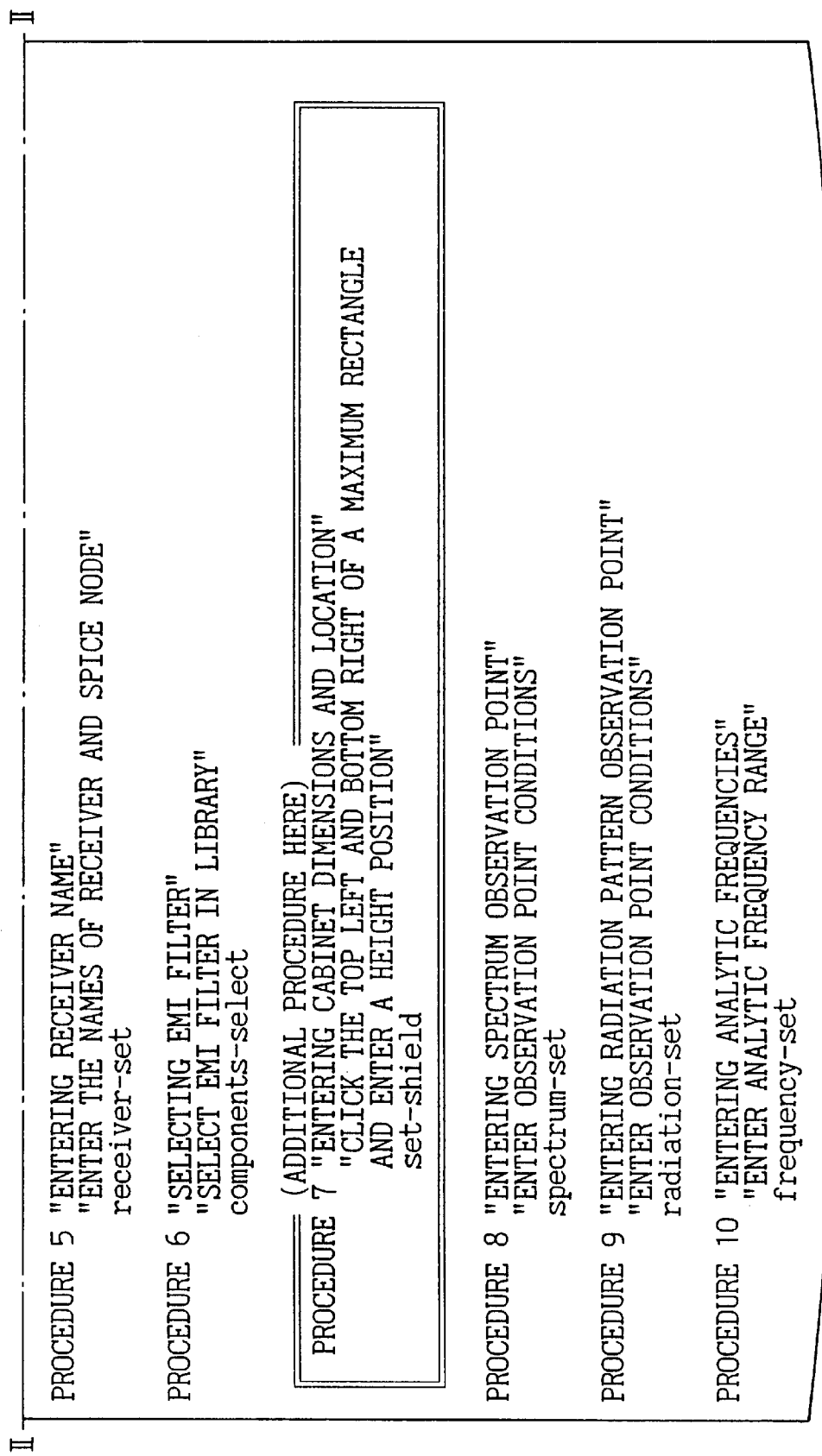

Fig. 25B

PROCEDURE 5 "ENTERING RECEIVER NAME"
"ENTER THE NAMES OF RECEIVER AND SPICE NODE"
receiver-set PROCEDURE 6 "SELECTING EMI FILTER"
"SELECT EMI FILTER IN LIBRARY"
components-select (ADDITIONAL PROCEDURE HERE)
PROCEDURE 7 "ENTERING CABINET DIMENSIONS AND LOCATION"
"CLICK THE TOP LEFT AND BOTTOM RIGHT OF A MAXIMUM RECTANGLE
AND ENTER A HEIGHT POSITION"
set-shield PROCEDURE 8 "ENTERING SPECTRUM OBSERVATION POINT"
"ENTER OBSERVATION POINT CONDITIONS"
spectrum-set PROCEDURE 9 "ENTERING RADIATION PATTERN OBSERVATION POINT"
"ENTER OBSERVATION POINT CONDITIONS"
radiation-set PROCEDURE 10 "ENTERING ANALYTIC FREQUENCIES"
"ENTER ANALYTIC FREQUENCY RANGE"
frequency-set

Fig.27

| EXAMPLE OF DATA STRUCTURE OF ANALYSIS CONTROL STATEMENT | NAMES OF PROCEDURES AND PARAMETERS OF EMBODIMENT |
|---|---|
| $band: START AND END FREQUENCIES | PROCEDURE 9: START FREQUENCY<br>PROCEDURE 9: END FREQUENCY |
| ... | ... |

Fig.28

| EXAMPLE OF DATA STRUCTURE OF MODEL DESCRIPTIVE STATEMENT | NAMES OF PROCEDURES AND PARAMETERS OF EMBODIMENT |
|---|---|
| $board: EXTERNAL DIMENSIONS OF BOARD | PROCEDURE 1: DIMENSIONS X AND Y |
| $layer: LAYER THICKNESS, LAYER HEIGHT, SIGNAL LAYER SHIFT AMOUNT, DIELECTRIC CONSTANT, AND CONDUCTIVITY | PROCEDURE 2: LAYER THICKNESSES t1 AND t2<br>PROCEDURE 2: LAYER HEIGHT h<br>PROCEDURE 2: SIGNAL LAYER SHIFT AMOUNT d<br>PROCEDURE 2: DIELECTRIC CONSTANT $\varepsilon r$<br>PROCEDURE 2: CONDUCTIVITY $\sigma$ |
| $segment: COORDINATES OF PATTERN CORNERS AND WIDTH | PROCEDURE 3: PATTERN LENGTH L<br>PROCEDURE 3: PATTERN WIDTH W |
| $driver: DRIVER NAME, BASIC FREQUENCY, AND DUTY | PROCEDURE 4: DRIVER NAME<br>PROCEDURE 4: BASIC FREQUENCY<br>PROCEDURE 4: DUTY |
| $receiver: RECEIVER NAME | PROCEDURE 5: RECEIVER NAME |
| $network: COUNTERMEASURE LOCATION AND LIBRARY NAME | PROCEDURE 3: COUNTERMEASURE LOCATION<br>PROCEDURE 6: LIBRARY NAME |
| $fragment: COORDINATES OF MESH INTERSECTIONS | CALCULATED FROM BOARD DIMENSIONS OF PROCEDURE 1 AND END FREQUENCY OF PROCEDURE 9 |

Fig.29

| EXAMPLE OF DATA STRUCTURE OF OUTPUT CONTROL STATEMENT | NAMES OF PROCEDURES AND PARAMETERS OF EMBODIMENT |
|---|---|
| $spectrum: BOARD CENTER POSITION, ANTENNA DISTANCE, AND ANTENNA HEIGHT | PROCEDURE 1: CENTER IS CALCULATED FROM BOARD DIMENSIONS<br>PROCEDURE 7: ANTENNA DISTANCE<br>PROCEDURE 7: ANTENNA HEIGHT |
| $radiation: BOARD CENTER POSITION, ANTENNA DISTANCE, AND ANTENNA HEIGHT | PROCEDURE 1: CENTER IS CALCULATED FROM BOARD DIMENSIONS<br>PROCEDURE 8: ANTENNA DISTANCE<br>PROCEDURE 8: ANTENNA HEIGHT |
| ... | ... |

APPARATUS FOR, AND METHOD OF, CALCULATING ELECTROMAGNETIC FIELD STRENGTH AND MEDIUM FOR RECORDING PROGRAM TO ACHIEVE THE METHOD

BACKGROUND OF THE INVENTION

1. Field of the Invention

The present invention relates to an apparatus for, and a method of, calculating the strength of an electromagnetic field radiated from an electric circuit device, and a medium for recording a program that achieves the method. In particular, the present invention relates to a technique of preparing primary data in a simulation tool such as these apparatus, method, and medium.

2. Description of the Related Art

The strength of an electromagnetic field radiated from an electric circuit device is calculated based on analytic data for the electric circuit device.

Prior Arts of calculating electromagnetic field strength according to the analytic data are disclosed in Japanese Unexamined Patent Publications No. 7-234890, No. 7-302277, No. 7-302278, No. 7-302258, No. 8-122377, No. 8-304491, No. 8-304492, No. 8-304493, and No. 8-304494.

To prepare the analytic data for an electric circuit device, an apparatus for calculating electromagnetic field strength must form models of printed circuit boards, cables, a cabinet, etc., of the electric circuit device. To prepare the models, primary data about the models must be prepared. The primary data must be quickly, efficiently, and easily prepared even by a novice having no skill in the field.

A prior art asks a user to enter mesh intervals as primary data for an object and prepares geometrical data for the object according to a known meshing technique with the use of the mesh intervals. The mesh intervals serve as units for analyzing an electromagnetic field radiated from the object.

To prepare the analytic data for an electric circuit device, it is necessary to collect primary data such as parameters and electric conditions to operate the electric circuit device. These parameters include the voltage levels of CMOSs, TTLs, and LSIs of the electric circuit device and the rising timing, falling timing, delay, pulse cycle, and pulse width of signals used by the electric circuit device.

In setting the mesh intervals, parameters, and electric conditions, the prior art relies on the skill of the user.

It is difficult for the prior art to maintain the same analysis conditions on each electric circuit device because the mesh intervals, for example, of even the same electric device are set differently depending on users. If the mesh intervals are too large, the accuracy of calculated electromagnetic field strength will be coarse, and if they are too small, a long time is needed for data preparation and strength calculation.

If the user is a novice, he or she will hardly understand the contents of the primary data for the strength calculation and have to refer to manuals. This takes a long time, and the user may not always select optimum parameters. Then, a result of the calculation fluctuates each time depending on the skill of the user, thereby deteriorating the efficacy and reliability of the calculation.

Learning how to prepare the primary data for calculating the electromagnetic field strength demands much labor of the user.

SUMMARY OF THE INVENTION

An object of the present invention is to provide an apparatus for and a method of easily and quickly preparing analytic data necessary for calculating the strength of an electromagnetic field radiated from an electric circuit device, even by a person having no skill in the field. The present invention also provides a medium for recording a program that achieves the method.

In order to accomplish the objects, the present invention provides an apparatus for and a method of calculating the strength of an electromagnetic field radiated from an electric circuit device according to analytic data. The apparatus and method employ a navigation file, a display unit, and a modeler. The navigation file stores procedures that at least include a procedure for prompting a user to enter the external dimensions of the electric circuit device and a procedure for prompting the user to enter signal frequencies on which the electric circuit device is divided into meshes and analyzed. The display unit sequentially displays the procedures so that the user may interactively set primary data according to the displayed procedures. The modeler prepares a model of the electric circuit device according to the primary data. The model is used to find analytic data to calculate the strength of the electromagnetic field. The present invention also provides a medium for recording a program that achieves the method.

The present invention enables the user to interactively enter primary data for a target electric circuit device according to procedures displayed on the display unit, and prepares a model of the target device according to the primary data. The model is used to calculate the strength of an electromagnetic field radiated from the target device. The present invention enables even a novice having no skill in preparing primary data to easily and quickly set optimum primary data. Namely, the present invention is capable of efficiently and correctly calculating the strength of an electromagnetic field always under the same analysis conditions without relying on a user's skill.

BRIEF DESCRIPTION OF THE DRAWINGS

The above object and features of the present invention will be more apparent from the following description of preferred embodiments when read with reference to the accompanying drawings, wherein:

FIG. 1 shows the principle of an apparatus for calculating the strength of an electromagnetic field strength according to the present invention;

FIG. 2 shows a model for evaluating an EMI filter for suppressing an electromagnetic field radiated from a printed circuit board made of a signal wiring layer and a ground layer of an electric circuit device;

FIG. 3 shows a model for evaluating the influence of common mode radiation from an interface cable such as an LCD cable of an electric circuit device;

FIG. 4 shows a model for evaluating the shielding effect of a cabinet and a printed circuit board of an electric circuit device;

FIG. 5 shows a model for evaluating a bypass capacitor arranged between a power source layer and a ground layer of a printed circuit board of an electric circuit device;

FIGS. 11A and 11B show the details of the procedures of FIG. 10;

FIGS. 25A and 25B show the details of the procedures of FIG. 24;

FIG. 27 shows an example of the data structure of an analysis statement block;

FIG. 28 shows an example of the data structure of a model descriptive statement block; and FIG. 29 shows an example of the data structure of an output statement block.

DESCRIPTION OF THE PREFERRED EMBODIMENTS

Figure 6:
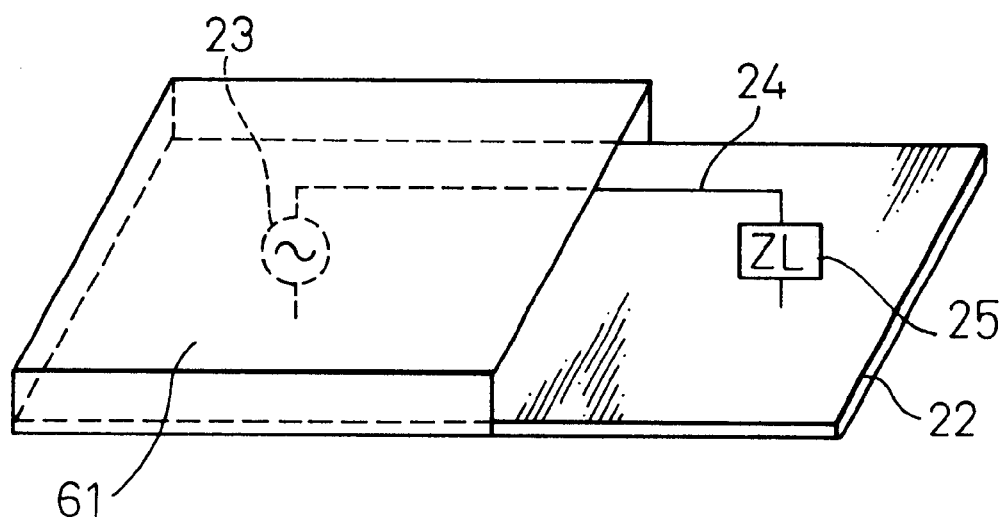
FIG. 6 shows a model for evaluating the shielding effect of an easy shield of a printed circuit board of an electric circuit device.

Embodiments of the present invention will be explained in detail with reference to the drawings.

FIG. 1 is a block diagram showing the principle of an apparatus for calculating the strength of an electromagnetic field radiated from an electric circuit device, according to the present invention.

The apparatus 1 has a navigation file 2, a reader 3 for reading the navigation file 2, a data preparation unit 4 for preparing analytic data, a memory 5, a writer 6 for writing the analytic data into an analytic data file 7, a calculator 8 for calculating the strength of an electromagnetic field, a resultant data file 9 for storing a result of the calculation, a display 10, and a keyboard 11.

The calculations carried out in the calculator 8 are based on a known technique disclosed in, for example, the Japanese Unexamined Patent Publications mentioned above.

The navigation file 2 contains procedures that are arranged in an optimum order to prepare primary data used for analyzing an electromagnetic field. The procedures at least include a procedure for prompting a user to enter the external dimensions of a target electric circuit device and a procedure for prompting the user to enter signal frequencies on which the electric circuit device is divided into meshes and analyzed.

When the user starts the apparatus 1, the display 10 displays analysis conditions so that the user may select one of the conditions. According to the selected condition, the reader 3 reads navigation procedures from the navigation file 2. The read procedures are stored in the memory 5 and are displayed on the display 10. The user interactively enters primary data such as parameters while referring to the display 10, and the data preparation unit 4 prepares analytic data according to the entered data. Namely, the apparatus 1 prompts the user to enter parameters serving as primary data, and the user only selects and/or enters the parameters with the keyboard 11 according to the prompts. The data preparation unit 4 checks the selected and/or entered parameters and stores them in the memory 5.

When the primary data is completely stored in the memory 5, the writer 6 converts the data into analytic data and stores it in the analytic data file 7.

The contents of the analytic data file 7 are transferred to the calculator 8, which calculates the strength of an electromagnetic field accordingly.

FIG. 2 shows a model for evaluating a countermeasure for suppressing an electromagnetic field radiated from a printed circuit board made of a signal wiring layer and a ground layer of an electric circuit device. The navigation file 2 stores at least one procedure for preparing this model. The model has the ground layer 22, a wave source or a driver 23, a wiring pattern 24, and a terminal resistor or a receiver 25. The user of the apparatus 1 follows the procedures displayed on the display 10 and enters parameters necessary for making the model. Instead, a standard model library (106 of FIG. 7) having standard parameters for the model may be employed.

FIG. 3 shows a model for evaluating the influence of common mode radiation from an interface cable such as an LCD cable of an electric circuit device. The navigation file 2 stores at least one procedure for preparing the model. Instead of the terminal resistor 25 of FIG. 2, the interface cable 31 is connected to a wiring pattern 24. The other parts of FIG. 3 are the same as those of FIG. 2 and are represented with like reference numerals. The user of the apparatus 1 enters parameters necessary for making the model according to the procedures displayed on the display 10. Instead, standard parameters stored in the standard library (106 of FIG. 7) may be employed to prepare the model.

FIG. 4 shows a model for evaluating the shielding effect of a cabinet and a printed circuit board of an electric circuit device. The navigation file 2 stores at least one procedure for preparing the model. The model has the cabinet 41 and an opening 42. The user of the apparatus 1 enters parameters such as the mesh intervals and part locations of the cabinet 41. Instead, standard parameters stored in the standard library (106 of FIG. 7) may be employed to form the model.

FIG. 5 shows a model for evaluating a bypass capacitor arranged between a power source layer and a ground layer of a printed circuit board of an electric circuit device. The navigation file 2 stores at least one procedure for preparing the model. The printed circuit board is 0.9 mm in thickness and 130 mm in each side length. The printed circuit board has a wave source S and the bypass capacitor arranged in the vicinity of the wave source S. The bypass capacitor serves as a load L. The printed circuit board is divided into meshes. The user of the apparatus 1 enters parameters such as the intervals of the meshes, the location, voltage, internal resistance of the wave source S, and the location and capacitance of the bypass capacitor. Instead, standard parameters stored in the standard model library (106 of FIG. 7) may be employed to form the model.

FIG. 6 shows a model for evaluating the shielding effect of an easy shield of a printed circuit board of an electric circuit device. The navigation file 2 stores at least one procedure for preparing the model. The shield 61 covers a wave source 23 and part of a wiring pattern 24 formed on the printed circuit board. The user of the apparatus 1 enters parameters related to these elements of the model. Instead, standard parameters stored in the standard model library (106 of FIG. 7) may be employed to form the model.

Figure 7:
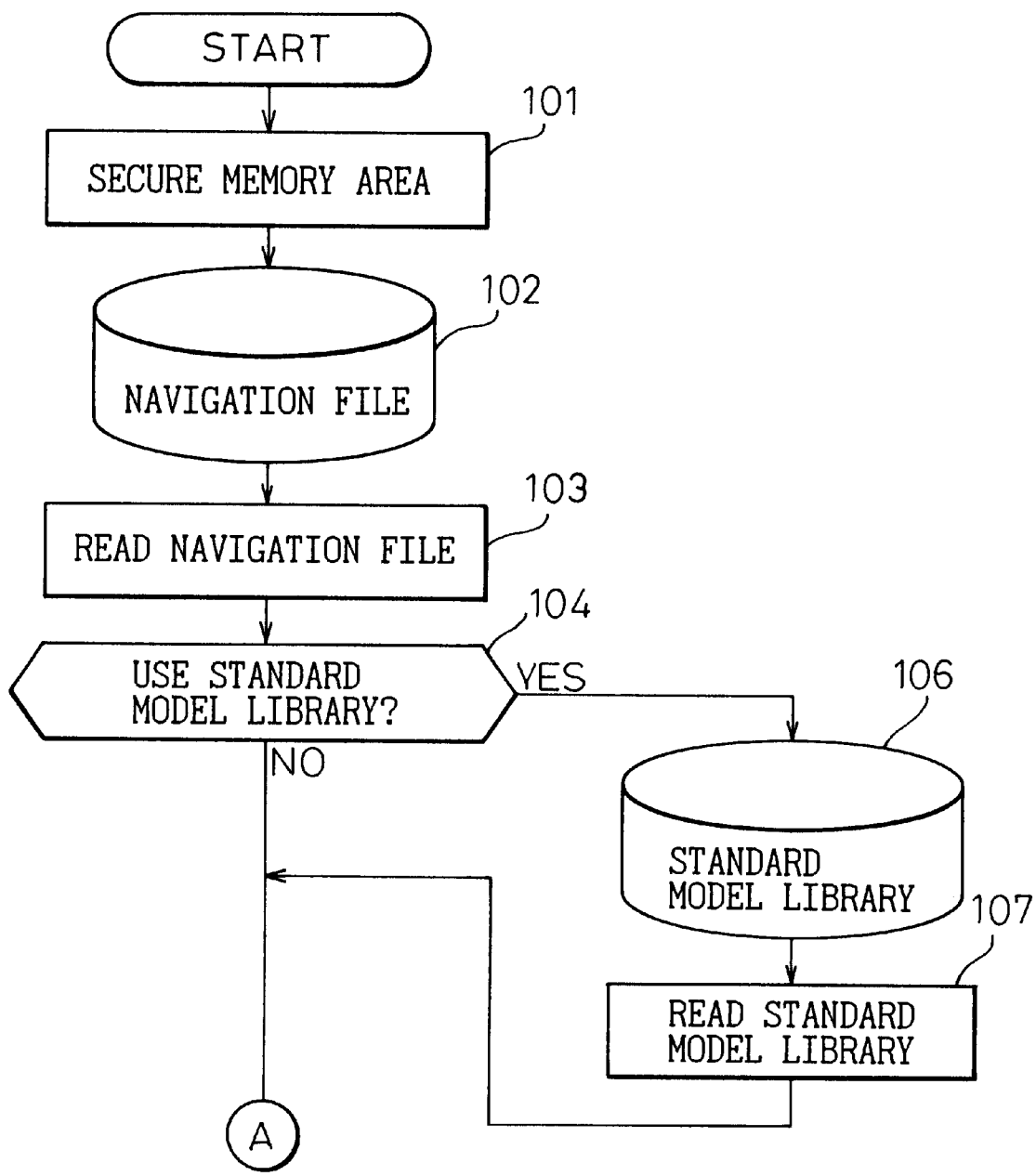
FIGS. 7 and 8 are flowcharts showing the operation of a data preparation unit 4 of FIG. 1.
Figure 8:
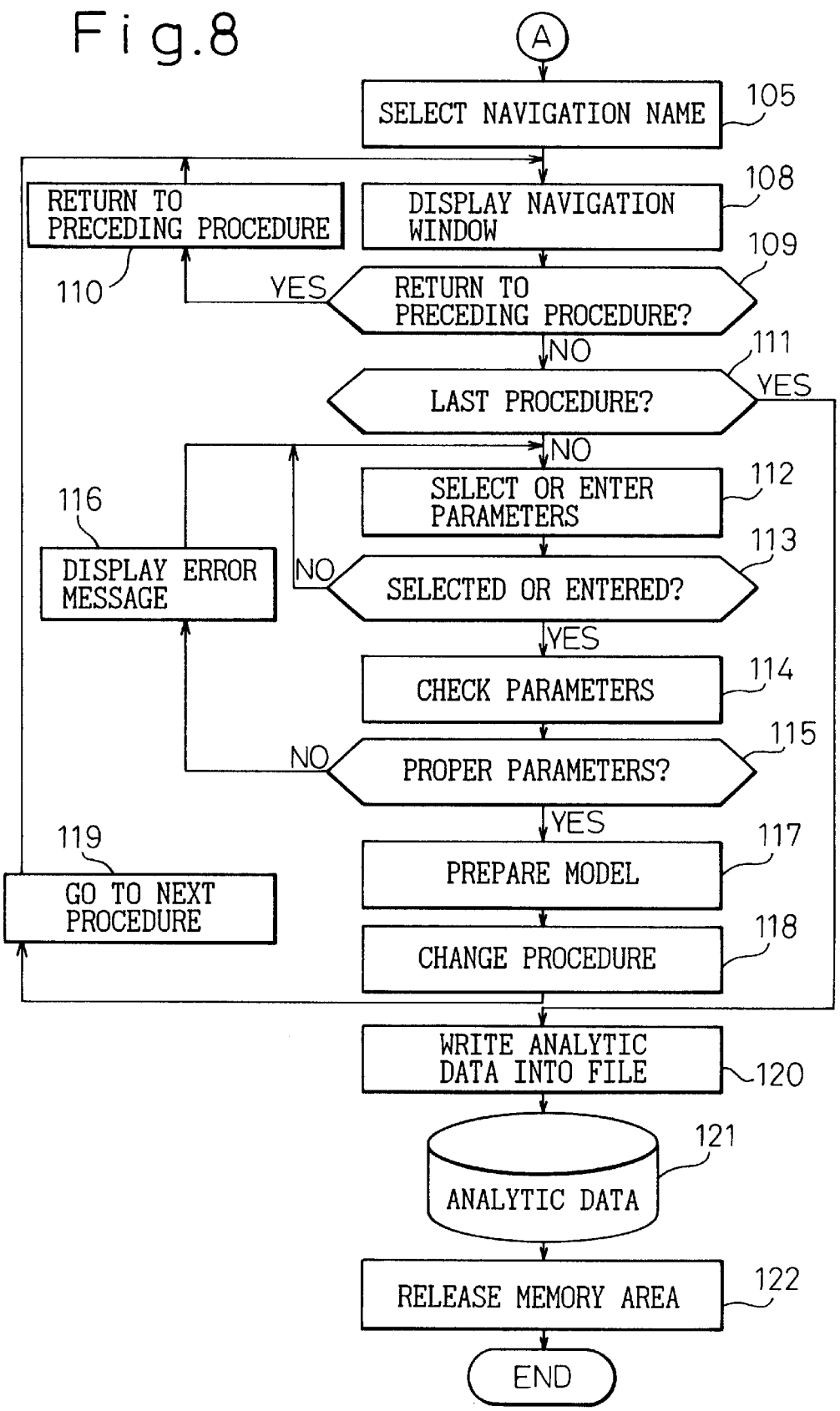

FIGS. 7 and 8 are flowcharts showing the details of the operation of the data preparation unit 4.

Step 101 secures an area of the memory 5. Steps 102 and 103 read data from the navigation file 2 and write the data into the memory 5. Step 104 determines whether or not the standard model library 106 is used. The library 106 stores standard parameters for the models of FIGS. 2 to 6.

If the library 106 is used, step 107 reads related data therefrom, and step 105 of FIG. 8 is carried out. If the library 106 is not used, step 105 of FIG. 8 is directly carried out from step 104.

Steps of FIG. 8 will be explained with reference to FIGS. 9 to 12.

Figure 9:
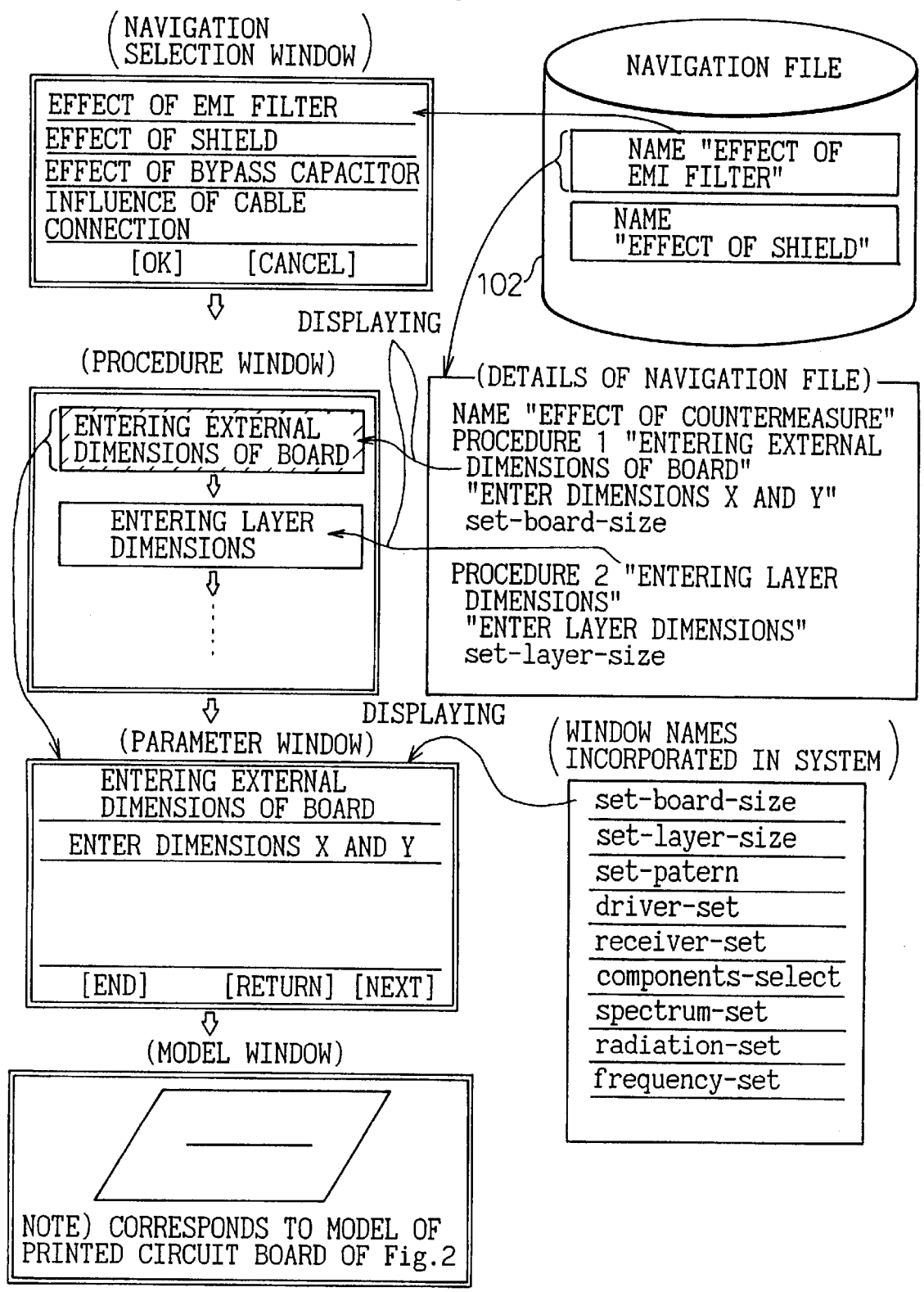
FIG. 9 shows a relationship between a navigation file and views on a display according to the present invention.

FIG. 9 shows a relationship between the navigation file 102 and windows and views on the display 10.

In step 105, the user selects one of navigation names on the display 10. In FIG. 9, the navigation names include "Effect of EMI filter," "Effect of Shield," "Effect of Bypass Capacitor," and "Influence of Cable Connection."

The navigation name "Effect of EMI filter" represents procedures for preparing a model for evaluating the effect of, for example, the countermeasure of FIG. 2 for suppressing an electromagnetic field radiated from the printed circuit board made of the signal wiring layer 24 and ground layer 22. As shown in FIG. 9, each procedure consists of a procedure name such as "Entering External Dimensions of Board," a message such as "Enter dimensions X and Y," and a window name such as "set-board-size."

The navigation name "Effect of Shield" represents procedures (not shown) for the models of FIGS. 4 and 6 for evaluating the shielding effect of a cabinet and an easy shield of a printed circuit board of an electric circuit device.

The navigation name "Effect of Bypass Capacitor" represents procedures (not shown) for making the model of FIG. 5 for evaluating the effect of a bypass capacitor arranged between a signal wiring layer and a ground layer of a printed circuit board.

The navigation name "Influence of Cable Connection" represents procedures (not shown) for preparing the model of FIG. 3 for evaluating the influence of common mode radiation from an interface cable or an LCD cable.

The operation of the present invention on the navigation name "Effect of EMI filter" will be explained. The following explanation is also applicable to the other navigation names.

After the navigation name "Effect of EMI filter" is selected by the user, step 108 displays a corresponding navigation window on the display 10. The navigation window consists of a procedure window, a parameter window, and a model window, as shown in FIG. 9.

The procedure window displays procedures carried out under the selected navigation name. A present one among the procedures is highlighted in the procedure window as hatched in FIG. 9.

Based on the present procedure, the parameter window shows the name of the procedure, a message, selection buttons and/or positions to enter parameters.

The model window shows a model made from entered parameters.

Figure 10:
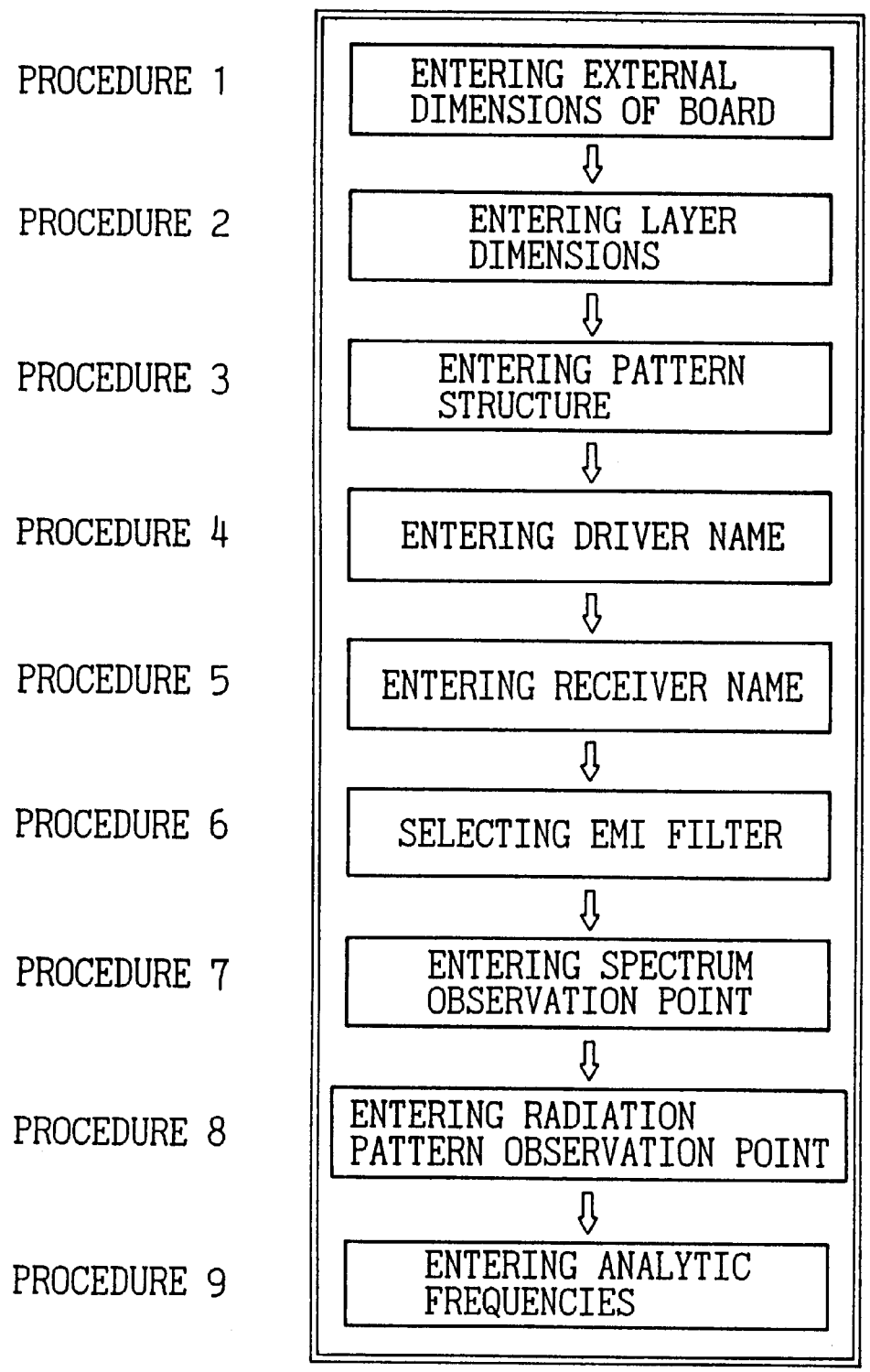
FIG. 10 shows procedures carried out under a navigation name of "Effect of EMI filter" according to the present invention.

FIG. 10 shows the details of the procedure window showing the names of the procedures 1 to 9 of the navigation name "Effect of EMI filter."

FIGS. 11A and 11B show the details of the procedures 1 to 9. Each of the procedures consists of the name of the procedure, a message, and the name of a view displayed in the parameter window.

The procedure window first highlights the procedure 1 "Entering External Dimensions of Board" as shown in FIG. 9. At this time, the parameter window shows the procedure name "Entering External Dimensions of Board" and a message of "Enter dimensions X and Y."

In step 109, the user determines whether or not the preceding view must be displayed. Since there is no preceding view for the procedure 1, step 109 provides a negative answer to go to step 111. If the present procedure is any one of the procedures 2 to 9, the user may want to correct parameters entered in the preceding view. In this case, the user selects "Return" in step 109, to return to step 108 to display the preceding procedure.

Step 111 determines whether or not the present procedure is the last one. If it is the last one, step 120 converts the entered parameters into analytic data and step 121 stores it into the analytic data file 7. Step 122 releases the secured memory area, and the process ends.

If step 111 determines that the present procedure is not the last one, the user selects and/or enters parameters in step 112. At this time, the parameter window shows a proper message for prompting the user to select and/or enter parameters. Accordingly, the user simply follows the message and selects and/or enters parameters that are within an allowable range.

Thereafter, the user selects "Next" in the parameter window, and step 113 determines whether or not the selection and/or entering operation is complete. In steps 114 and 115, the data preparation unit 4 checks to see if the entered parameters are in a predetermined range. If the parameters are improper, step 116 displays an error message, and the flow returns to step 112 to prompt the user to again select and/or enter the parameters.

If step 115 determines that the parameters are proper, step 117 prepares an analytic model for the present procedure according to the selected and/or entered parameters. The model is displayed in the model window.

Step 118 changes the presently highlighted procedure into a processed color, highlights the next procedure, and displays the remaining procedures in a color representing an unprocessed state. Step 119 proceeds to the next procedure, and step 108 is repeated.

Figure 12:
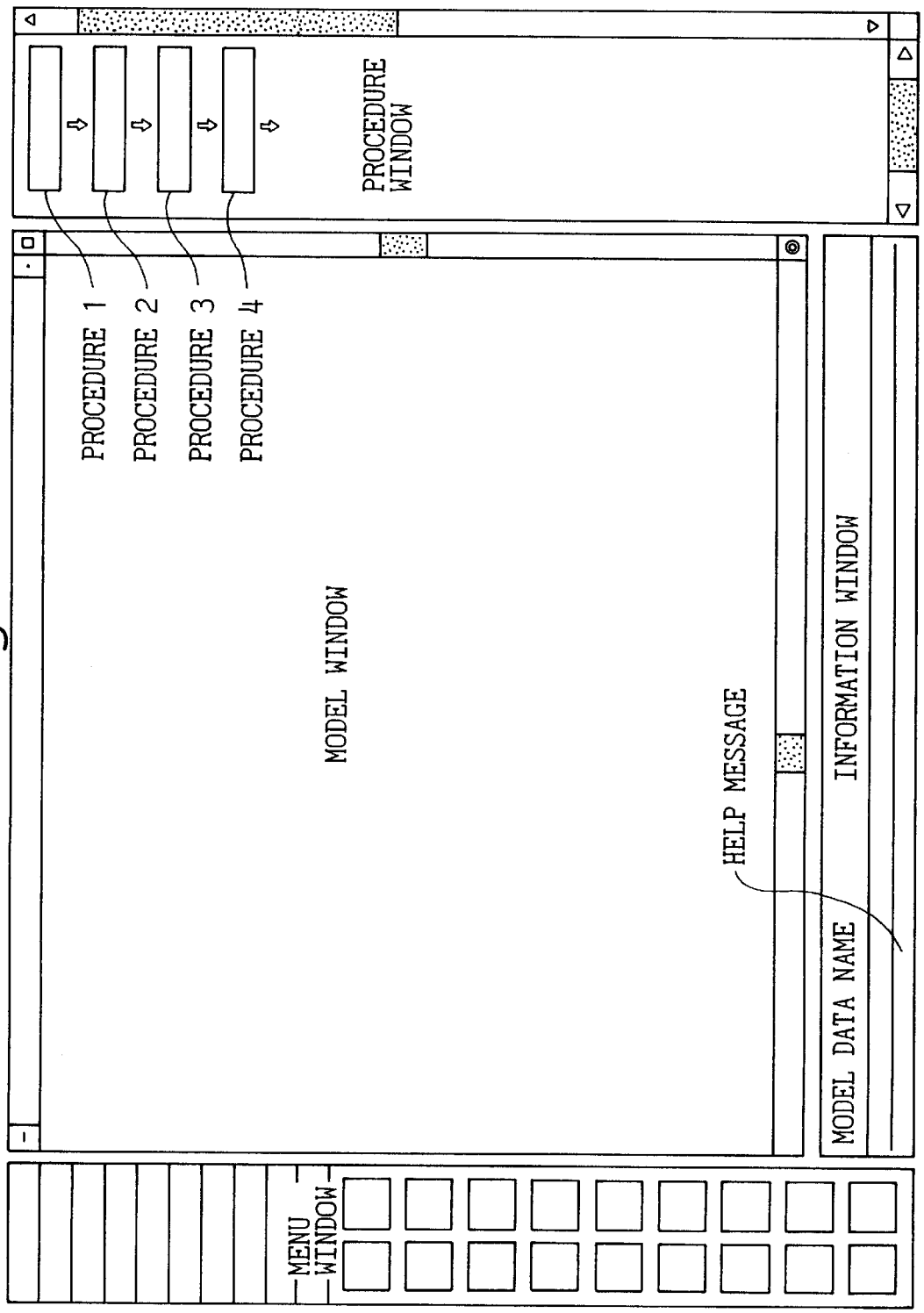
FIG. 12 shows an example of a view on a display according to the present invention.

FIG. 12 shows an example of a layout on the display 10. The procedure window is at the right side, and the model window is at the center. Although not shown in FIG. 12, the parameter window is overlaid on the model window. The parameter window is removable so that it will not interfere with the model window when the user watches the model window.

Figure 13:
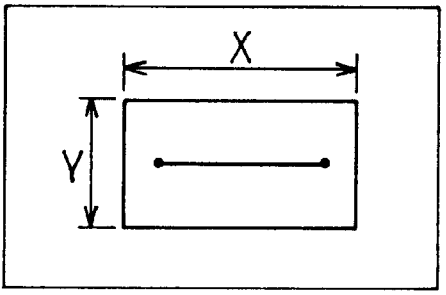
FIGS. 13 to 21 show examples of windows and views for entering parameters according to the procedures 1 to 9 of FIG. 10.

FIG. 13 shows a view in the parameter window for the procedure 1. The window shows the procedure name "Entering External Dimensions of Board" at the top thereof and the message "Enter dimensions X and Y" below the procedure name. The window also shows an outline of a board to let the user enter the dimensions X and Y of the board in step 112. The dimensions accompany units so that the user may easily enter the dimensions. Thereafter, the user selects "Next" in the parameter window in step 113, to go to step 114. If the user is not familiar with how to enter the parameters, the user may display a help message. If the entered parameters are proper, step 117 prepares a model, which is displayed in the model window.

Figure 14:
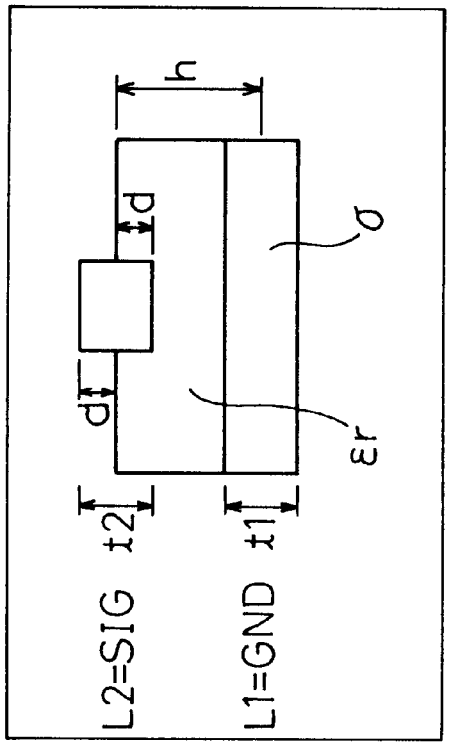

FIG. 14 shows a view in the parameter window for the procedure 2. The window shows a procedure name of "Entering Layer Dimensions" at the top thereof and a message of "Enter layer dimensions" below the procedure name. The window also shows outlines of a ground layer L1 and signal layer L2 to let the user enter layer thicknesses t1 and t2, a layer height h, a signal layer shifting direction, a signal layer shift amount d, a dielectric constant ∈r, and a conductivity a in step 112. These parameters accompany units so that the user may easily enter the parameters. Thereafter, the user selects "Next" in the window in step 113. If the user wants to return to the preceding procedure, the user selects "Return" in the window in step 109. If the user is not familiar with how to enter the parameters, the user may display a help message. The other steps of the procedure 2 are the same as those of the procedure 1.

Figure 15:
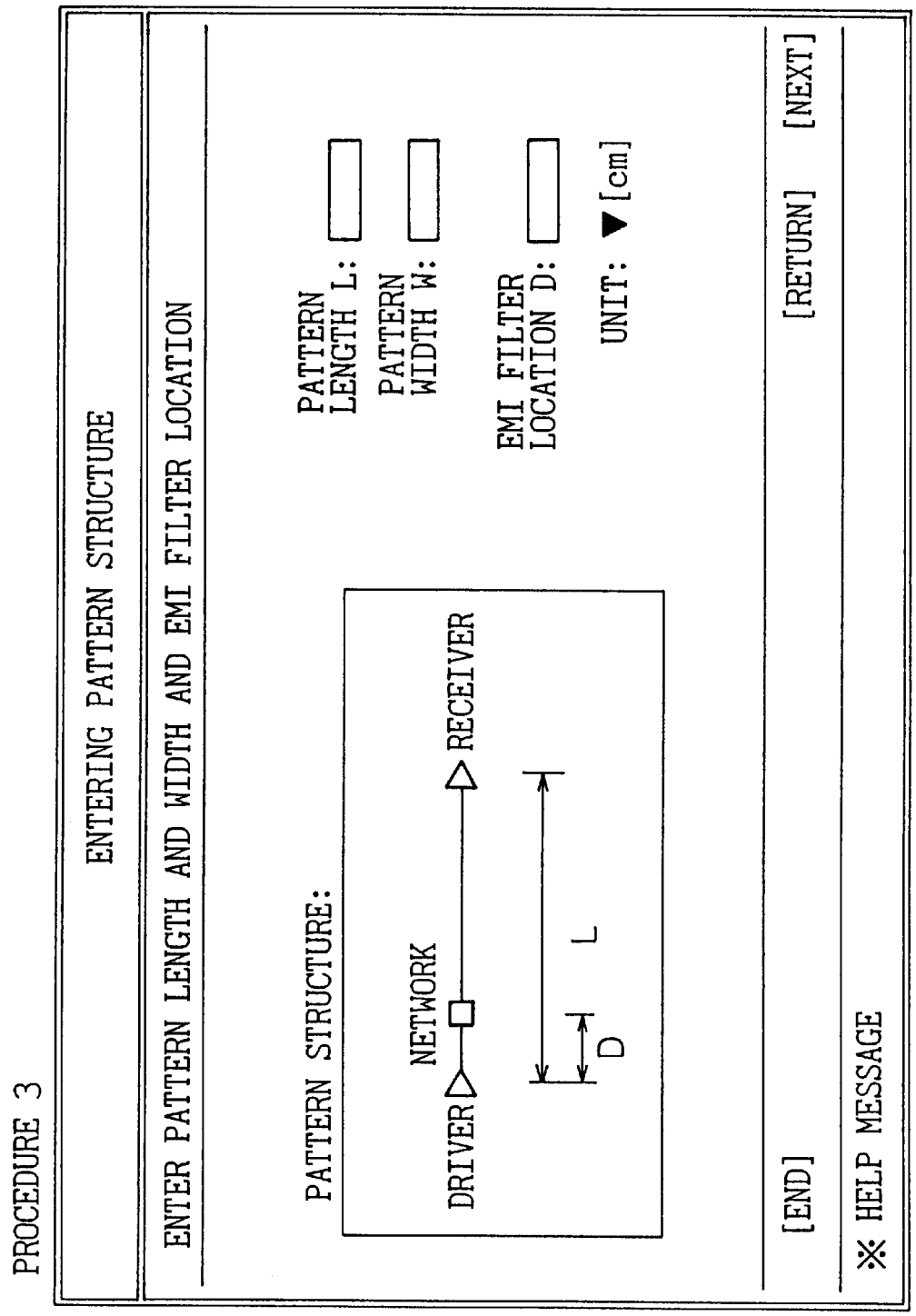

FIG. 15 shows a view in the parameter window for the procedure 3. The window shows a procedure name of "Entering Pattern Structure" at the top thereof and a message of "Enter pattern length and width and EMI filter location" below the procedure name. The window also shows the structure of a pattern consisting of a driver (a wave source), a wiring pattern, a network (the EMI filter), and a receiver (a terminal resistor), to let the user enter a pattern length L, pattern width W, and EMI filter location D in step 112. These parameters accompany units so that the user may easily enter the parameters. The other steps of the procedure 3 are the same as those of the procedure 2 of FIG. 14.

Figure 16:
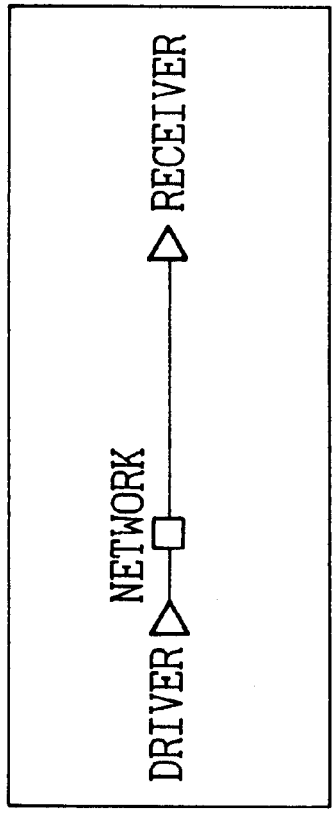

FIG. 16 shows a view in the parameter window for the procedure 4. The window shows a procedure name of "Entering Driver Name" at the top thereof and a message of "Enter the names of driver and spice node" below the procedure name. The window also shows the pattern structure consisting of the driver (wave source), network, and receiver (terminal resistor), to let the user enter the names of driver and spice node, a fundamental frequency, and duty in step 112. The spice node is a node connected to a tool "spice" for analyzing circuits. The other steps of the procedure 4 are the same as those of the procedure 2 of FIG. 14.

Figure 17:
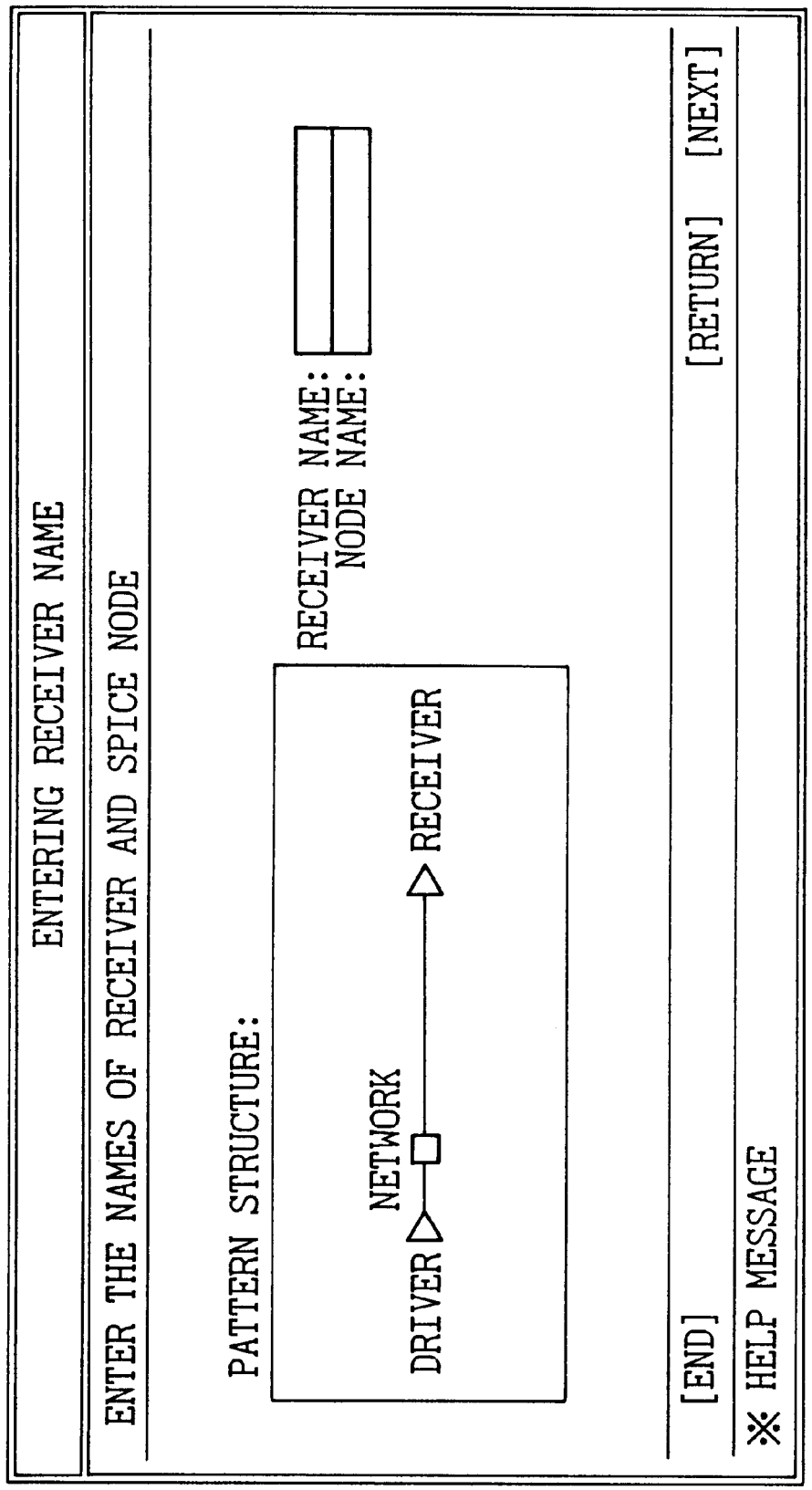

FIG. 17 shows a view in the parameter window for the procedure 5. The window shows a procedure name of "Entering Receiver Name" at the top thereof and a message of "Enter the names of receiver and spice node" under the procedure name. The window also shows the pattern structure consisting of the driver (wave source), network, and receiver (terminal resistor), to let the user enter the names of receiver and spice node in step 112. The other steps of the procedure 5 are the same as those of the procedure 4 of FIG. 16.

Figure 18:
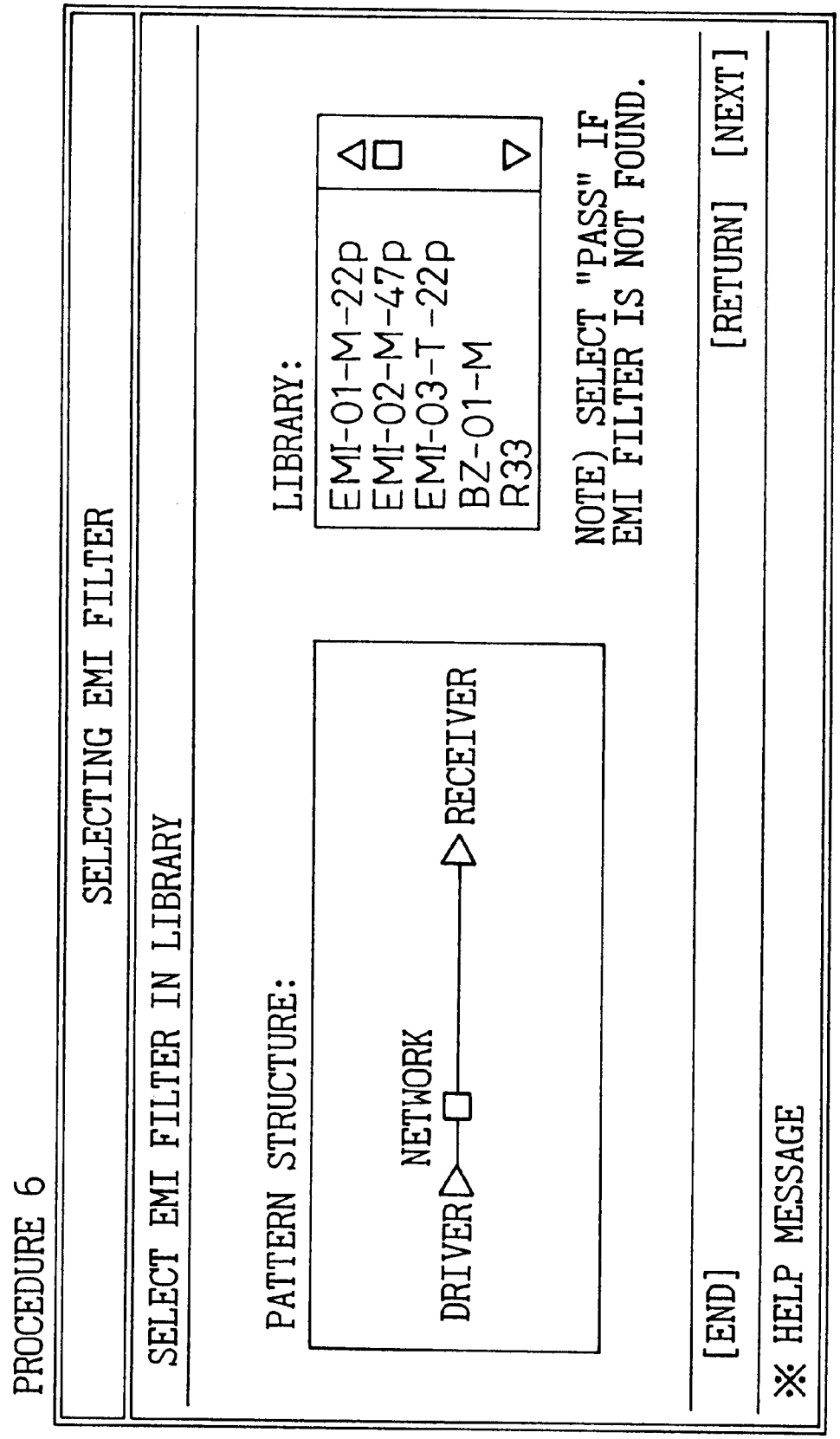

FIG. 18 shows a view in the parameter window for the procedure 6. The window shows a procedure name of "Selecting EMI filter" at the top thereof and a message of "Select EMI filter in library" below the procedure name. The window also shows the pattern structure consisting of the driver (wave source), network (EMI filter), and receiver (terminal resistor). The user selects a EMI filter from a library. In this example, the library contains three EMI filters, a bead core BZ-01-M, and a damping resistor R33. If a proper one is not in the library, the user scrolls the library to select "PASS." The other steps of the procedure 6 are the same as those of the procedure 2 of FIG. 14.

Figure 19:
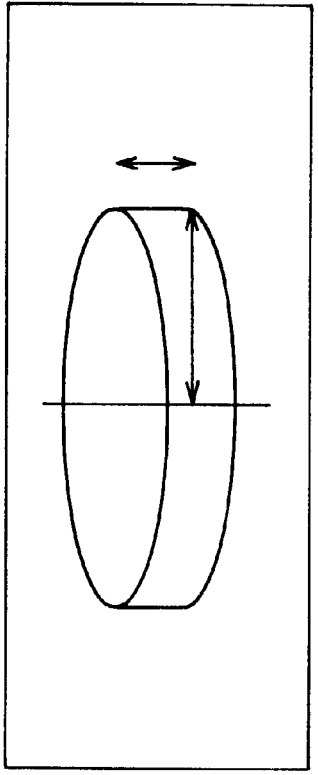

FIG. 19 shows a view in the parameter window for the procedure 7. The window shows a procedure name of "Entering Spectrum Observation Point" at the top thereof and a message of "Enter observation point conditions" below the procedure name, to let the user enter an antenna distance and height at a spectrum observation point. The antenna distance and height are necessary only to find analytic data in step 120, and therefore, their models are not displayed.

The other steps of the procedure 7 are the same as those of the procedure 2 of FIG. 14.

Figure 20:
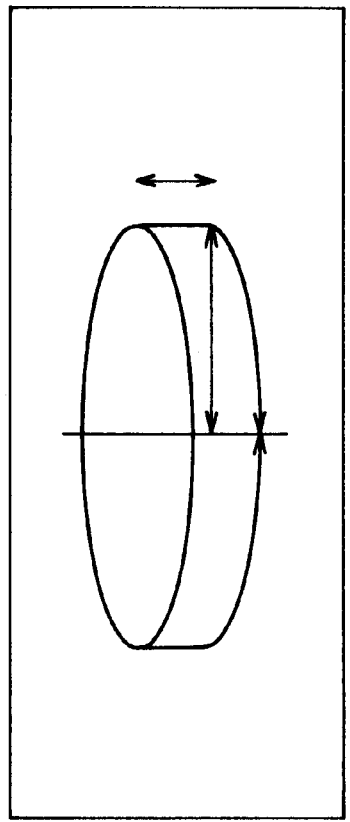

FIG. 20 shows a view in the parameter window for the procedure B. The window shows a procedure name of "Entering Radiation Pattern Observation Point" at the top thereof. The other steps of the procedure 8 are the same as those of the procedure 7 of FIG. 19.

Data about the spectrum observation point and radiation pattern observation point is essential for analyzing an electromagnetic field. As shown in FIGS. 19 and 20, the present invention shows the user the physical meanings of the antenna distance and height so that the user may understand the meanings of the parameters and smoothly enter them.

Figures 21, 22:
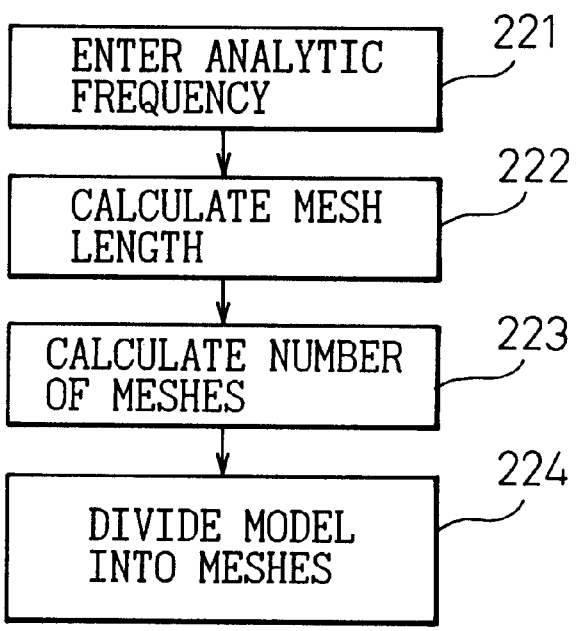
FIG. 22 is a flowchart showing a process of dividing an object into meshes according to the present invention.

FIG. 21 shows a view in the parameter window for the procedure 9. The window shows a procedure name of "Entering Analytic Frequencies" at the top thereof and a message of "Enter analytic frequency range" below the procedure name, to let the user enter a range of analytic frequencies. The other steps of the procedure 9 are the same as those of the procedure 7 of FIG. 19.

FIG. 22 is a flowchart showing a process of dividing an object into meshes according to the present invention. In step 221, the user enters an analytic frequency in the window of FIG. 21. According to the frequency, step 222 calculates mesh length as follows:

Mesh length (m)=0.05*{300/frequency (MHz)}

Empirically, it is known that optimum mesh length are 0.05λ or below, where λ is a wavelength which is 1 m at 300 MHz.

Figure 23:
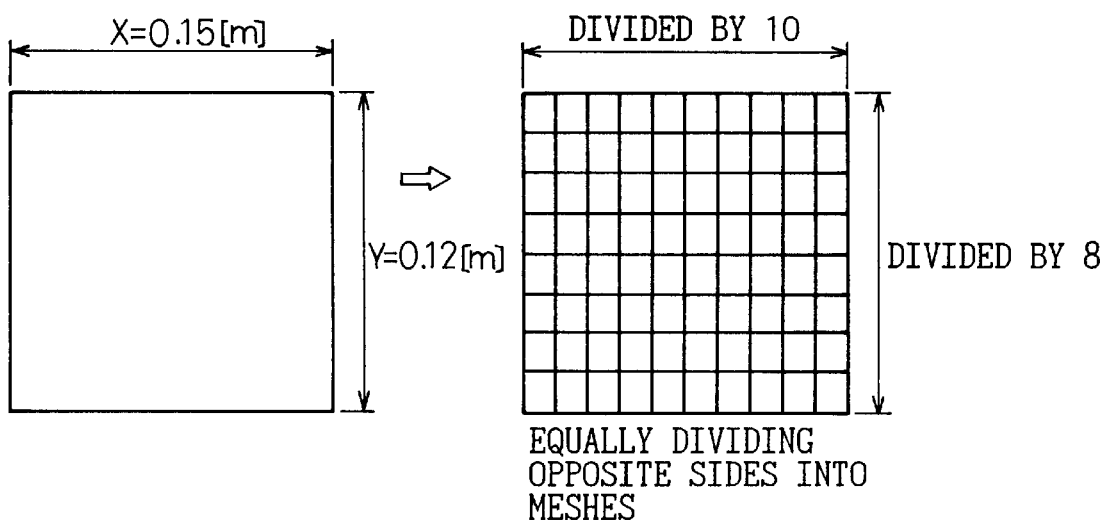
FIG. 23 shows a model before and after being divided into meshes.

FIG. 23 shows a model before and after being divided into meshes. The model has a width X of 0.15 (m) and a length Y of 0.12 (m).

If the analytic frequency is 1000 MHz (=1 GHz), the model is divided into meshes as follows:

$$\text{Mesh length} = 0.05 * \{300/1000 \text{ (MHz)}\}$$
$$= 0.015 \text{ (m)}$$
$$\text{Number of meshes in } X \text{ direction} = 0.15/0.015$$
$$= 10$$
$$\text{Number of meshes in } Y \text{ direction} = 0.12/0.015$$
$$= 8$$

In this way, the present invention calculates mesh length according to an analytic frequency, to divide an object into meshes that are optimum for analyzing an electromagnetic field radiated from the object.

Figure 24:
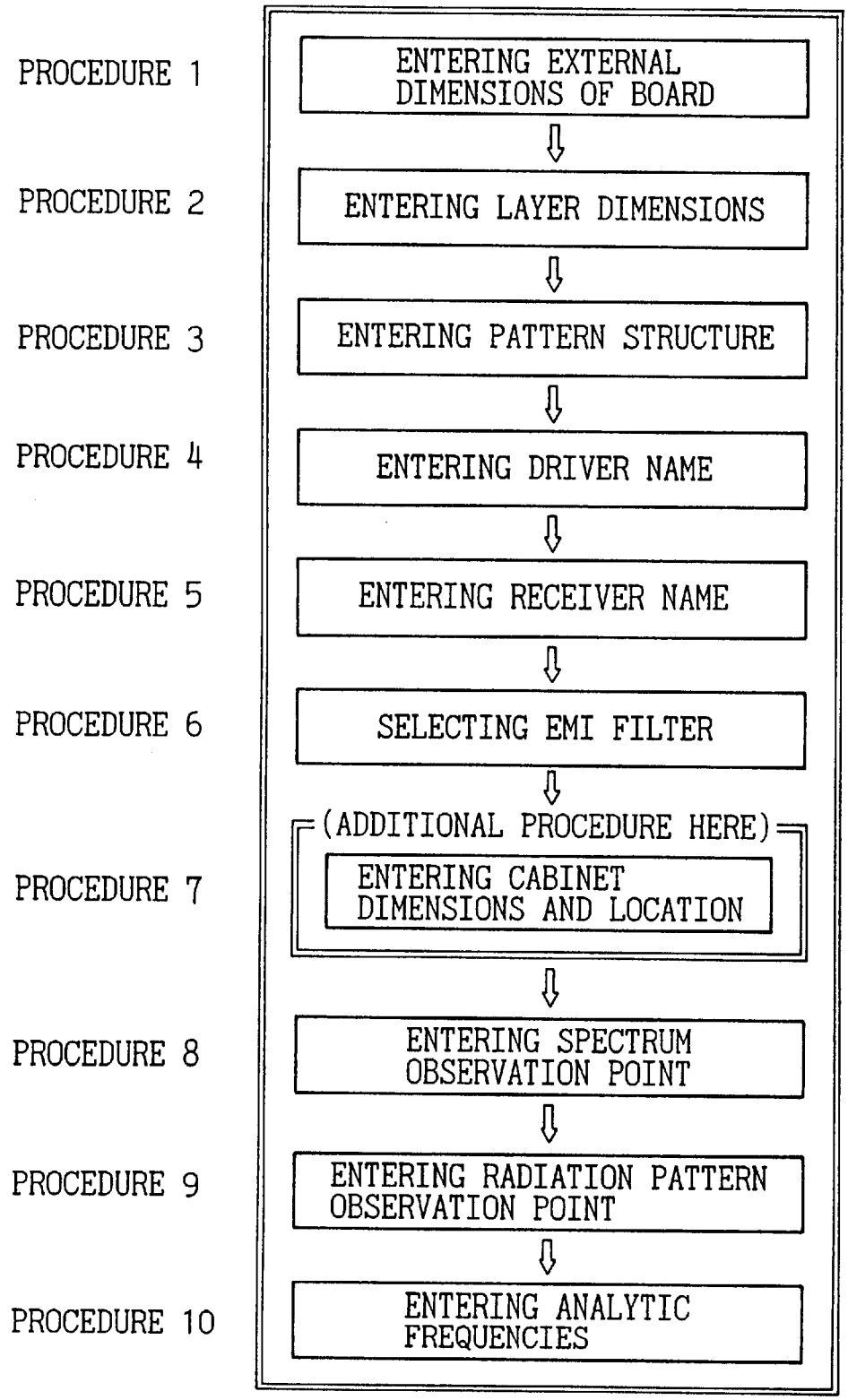
FIG. 24 shows other procedures carried out under the navigation name "Effect of EMI filter" according to the present invention.

FIG. 24 shows the procedure window that is displaying the names of procedures handled under the navigation name "Effect of EMI filter" according to another embodiment of the present invention. What is different from FIG. 10 is that FIG. 24 has an additional procedure of "Entering Cabinet Dimensions and Location" as a procedure 7. As a result, procedures 8 to 10 of FIG. 24 correspond to the procedures 7 to 9 of FIG. 10. In this way, the present invention is capable of freely adding and removing procedures to and from the procedure window. The present invention, therefore, is flexible to prepare data for evaluating the effect of EMI filter for suppressing electromagnetic field radiation.

Figure 25A:
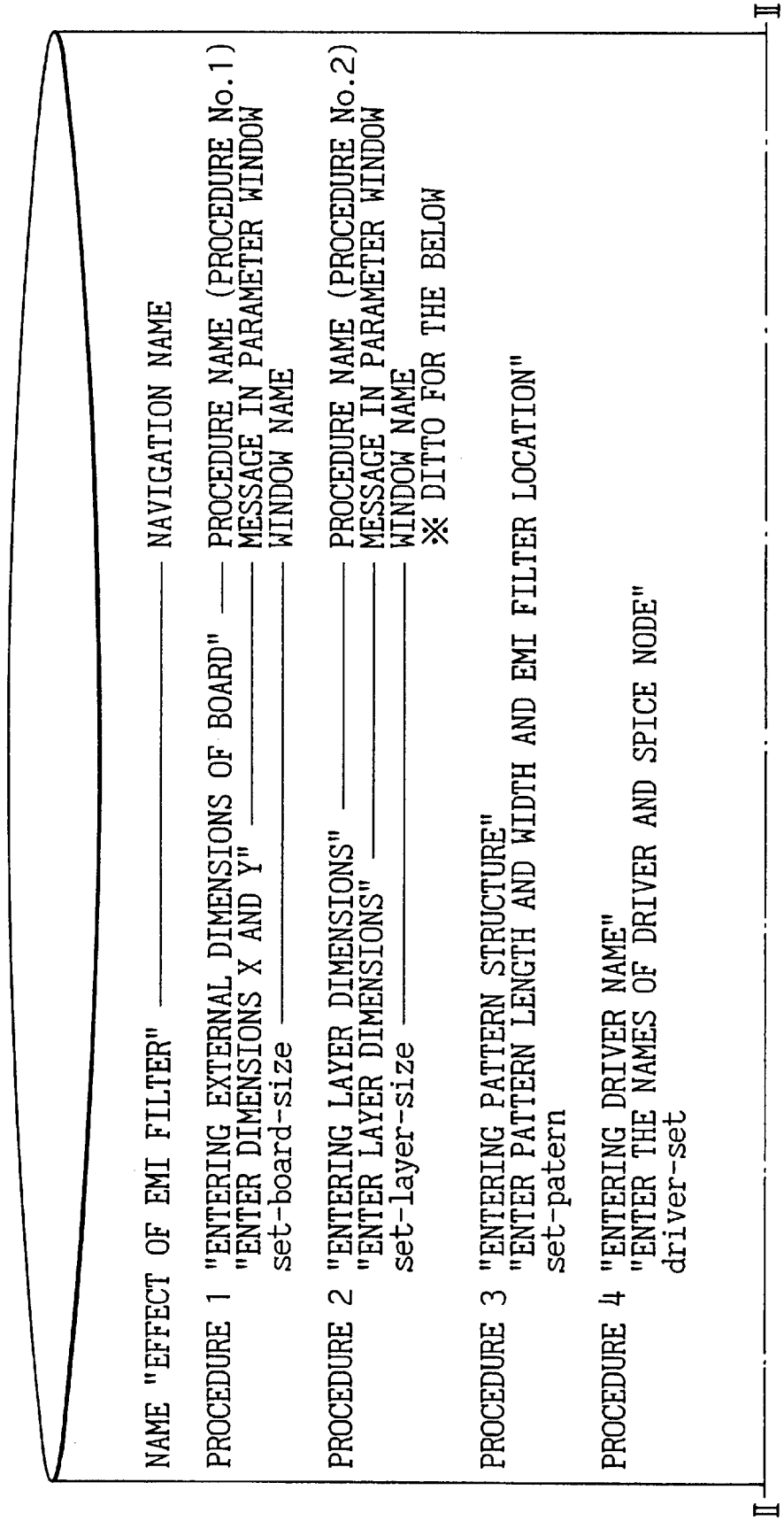

FIGS. 25A and 25B show the details of the procedures of FIG. 24. The additional procedure 7 "Entering Cabinet Dimensions and Location" involves a message of "Click the top left and bottom right of a maximum rectangle and enter a height position" and the name of a view of "set-shield" to be displayed in the parameter window. The procedures 1 to 6 of FIGS. 25A and 25B are the same as the procedures 1 to 6 of FIGS. 11A and 11B, and the procedures 8 to 10 of FIG. 25B are the same as the procedures 7 to 9 of FIG. 11B.

Figure 26:
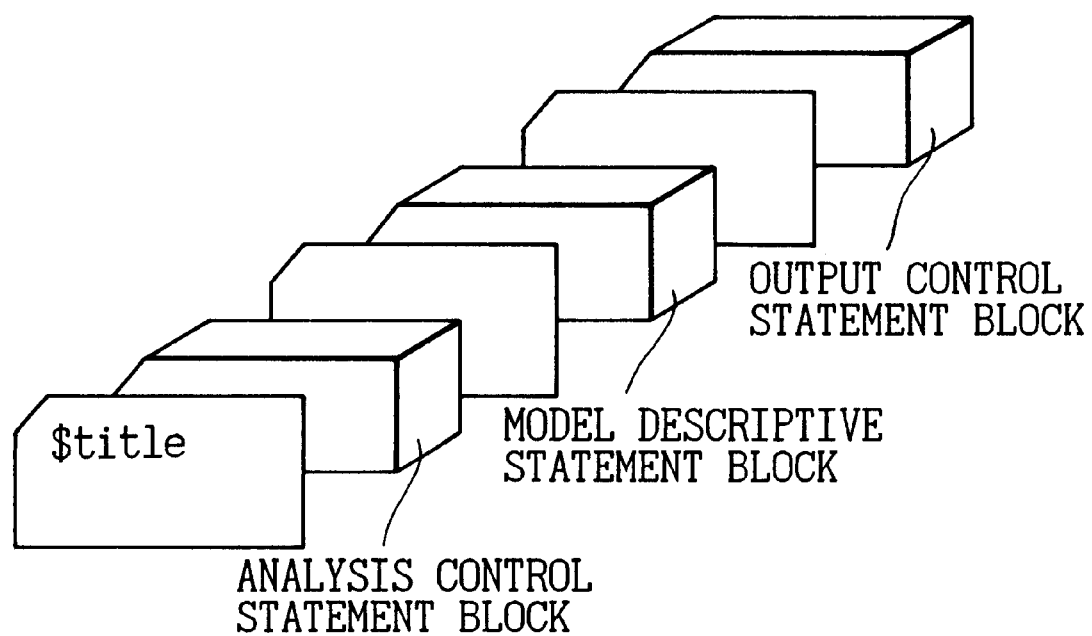
FIG. 26 shows an example of the structure of analytic data prepared from primary data.

FIG. 26 shows the structure of analytic data prepared according to primary data made from the selected and/or entered parameters. The analytic data consists of blocks each having titles. In FIG. 26, the analytic data includes an analysis control statement block, a model descriptive statement block, and an output control statement block.

FIG. 27 shows a typical structure of the analysis control statement block. Data "$band" is made from the start and end frequencies set in the procedure 9 of FIG. 11.

FIG. 28 shows a typical structure of the model descriptive statement block. Data "$board" is prepared from the external board dimensions X and Y set in the procedure 1. Data "$layer" is prepared from the layer thicknesses t1 and t2, layer height h, signal layer shift amount d, dielectric constant $\in r$, and conductivity $\sigma$ set in the procedure 2.

Other pieces of data "$segment," "$driver," "$receiver," "$network," and "$fragment" are prepared from the data set in the respective procedures.

FIG. 29 shows a typical structure of the output control statement block. Data "$spectrum" is prepared from the board dimensions set in the procedure 1 and the antenna distance and height set in the procedure 7 of FIG. 11.

A technique of preparing these statement blocks (analytic data) from entered parameters (primary data) is disclosed in the above-mentioned Japanese Unexamined Patent Publication Nos. 7-234890, 7-302277, 7-302278, 7-302258, 8-122377, 8-304491, 8-304492, 8-304493, and 8-304494. These documents also disclose a technique of calculating the strength of an electromagnetic field radiated from an electric circuit device according to the analytic data.

As explained above, the present invention provides an apparatus for, and a method of, enabling even a novice to easily and quickly prepare primary data necessary for forming analytic data to efficiently calculate the strength of an electromagnetic field radiated from an electric circuit device. The present invention also provides a medium for recording a program that achieves the method.

What is claimed is:

1. An apparatus for calculating the strength of an electromagnetic field radiated from an electric circuit device according to analytic data obtained from a model of the electric circuit device, comprising:
    a storage unit to store a navigation file of procedures that include at least a procedure for prompting a user to enter external dimensions of the electric circuit device and a procedure for prompting the user to enter signal frequencies on which the electric circuit device is divided into meshes and analyzed;
    a display unit;
    a data preparation unit, coupled to said display unit and said storage unit, to sequentially display the procedures on said display unit and guide a user to interactively set primary data used in calculating the electromagnetic field to prepare the model of the electric circuit device;
    a writer to prepare the analytic data according to the model; and
    a calculation unit, coupled to said data preparation unit, to prepare the model according to the primary data.

2. The apparatus of claim 1, wherein the primary data is set according to a sequence of the procedures stored in the navigation file.

3. The apparatus of claim 2, wherein the procedures stored in the navigation file are grouped according to kinds of the primary data and are rewritable by the user.

4. The apparatus of claim 2,
    wherein said storage unit further stores a model library of model data for standard models; and
    wherein said apparatus further comprises a reader unit, coupled to said data preparation unit, to read the model data from the model library said data preparation unit using the model data for forming at least part of the primary data.

5. The apparatus of claim 1, wherein the navigation file includes at least a procedure for preparing a model for evaluating an EMI filter for suppressing an electromagnetic field radiated from a printed circuit board made of a signal wiring layer and a ground layer of the electric circuit device.

6. The apparatus of claim 1, wherein the navigation file includes at least a procedure for preparing a model for evaluating a shielding effect of a cabinet and a printed circuit board of the electric circuit device.

7. The apparatus of claim 1, wherein the navigation file includes at least a procedure for preparing a model for evaluating a shielding effect of an easy shield and a printed circuit board of the electric circuit device.

8. The apparatus of claim 1, wherein the navigation file includes at least a procedure for preparing a model for evaluating a bypass capacitor arranged between a power source layer and a ground layer of a printed circuit board of the electric circuit device.

9. The apparatus of claim 1, wherein the navigation file includes at least a procedure for preparing a model for evaluating the influence of common mode radiation from an interface cable of the electric circuit device.

10. A method of providing data to calculate the strength of an electromagnetic field radiated from an electric circuit device according to analytic data, comprising:
    sequentially displaying, on a display, procedures that include at least a procedure for prompting a user to enter external dimensions of the electric circuit device and a procedure for prompting the user to enter signal frequencies on which the electric circuit device is divided into meshes and analyzed;
    interactively setting primary data according to the displayed procedures;
    preparing a model of the electric circuit device according to the primary data;
    preparing the analytic data according to the model; and
    calculating the strength of the electromagnetic field radiated from the electric circuit device according to the analytic data.

11. The method of claim 10, wherein the primary data is set according to a sequence of the procedures displayed on the display means.

12. The method of claim 11, wherein the procedures are grouped according to kinds of primary data and are rewritable by a user.

13. The method of claim 10, wherein at least part of the primary data is made from model data read out of a model library storing data for standard models.

14. The method of claim 10, wherein the procedures include at least a procedure for preparing a model for evaluating an EMI filter for suppressing an electromagnetic field radiated from a printed circuit board made of a signal wiring layer and a ground layer of the electric circuit device.

15. The method of claim 10, wherein the procedures include at least a procedure for preparing a model for evaluating a shielding effect of a cabinet and a printed circuit board of the electric circuit device.

16. The method of claim 10, wherein the procedures include at least a procedure for preparing a model for evaluating a shielding effect of a simple shield and a printed circuit board of the electric circuit device.

17. The method of claim 10, wherein the procedures include at least a procedure for preparing a model for evaluating a bypass capacitor arranged between a power source layer and a ground layer of a printed circuit board of the electric circuit device.

18. The method of claim 10, wherein the procedures include at least a procedure for preparing a model for evaluating the influence of common mode radiation from an interface cable of the electric circuit device.

19. A computer-readable medium storing a program for controlling a computer to perform a method of providing data to calculate the strength of an electromagnetic field radiated from an electric circuit device according to analytic data, the method comprising:

sequentially displaying, on a display, procedures that include at least a procedure for prompting a user to enter external dimensions of the electric circuit device and a procedure for prompting the user to enter signal frequencies on which the electric circuit device is divided into meshes and analyzed;

interactively setting primary data according to the displayed procedures;

preparing a model of the electric circuit device according to the primary data;

preparing the analytic data according to the model; and calculating the strength of the electromagnetic field radiated from the electric circuit device according to the analytic data.

20. An apparatus for providing data used to calculate the strength of an electromagnetic field radiated from an electric circuit device according to analytic data obtained from a model of the electric circuit device, comprising:

an input/output unit;

a storage unit to store a navigation file of procedures that include at least a procedure for prompting a user to enter external dimensions of the electric circuit device and a procedure for prompting the user to enter signal frequencies on which the electric circuit device is divided into meshes and analyzed;

a data preparation unit, coupled to said input/output unit and said storage unit, to sequentially display the procedures on the input/output unit and guide a user to interactively set primary data used in calculating the electromagnetic field;

a writer to prepare the analytic data according to the model; and a calculation unit, coupled to said data preparation unit, to prepare the model according to the primary data.

* * * * *